(12) United States Patent
Egawa et al.

(10) Patent No.: US 6,867,069 B2
(45) Date of Patent: Mar. 15, 2005

(54) SEMICONDUCTOR PACKAGE WITH A CHIP CONNECTED TO A WIRING SUBSTRATE USING BUMP ELECTRODES AND UNDERFILLED WITH SEALING RESIN

(75) Inventors: Yoshimi Egawa, Tokyo (JP); Kazumi Shinchi, Miyazaki (JP); Takeshi Niigaki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/631,741

(22) Filed: Aug. 1, 2003

(65) Prior Publication Data

US 2004/0023438 A1 Feb. 5, 2004

Related U.S. Application Data

(62) Division of application No. 10/062,433, filed on Feb. 5, 2002, now Pat. No. 6,635,963, which is a division of application No. 09/497,685, filed on Feb. 4, 2000, now Pat. No. 6,376,278.

(30) Foreign Application Priority Data

Apr. 1, 1999 (JP) .............................................. 11-94832

(51) Int. Cl.[7] ......................................... H01L 21/8256
(52) U.S. Cl. ........................ 438/113; 438/126; 438/464
(58) Field of Search ................................. 438/108, 113, 438/124, 126, 127, 462, 464

(56) References Cited

U.S. PATENT DOCUMENTS

| 5,518,964 | A | 5/1996 | DiStefano et al. |
| 5,670,826 | A | 9/1997 | Bessho et al. |
| 5,817,545 | A | 10/1998 | Wang et al. |
| 5,889,332 | A | 3/1999 | Lawson et al. |
| 5,989,982 | A | 11/1999 | Yoshikazu |
| 6,004,867 | A | 12/1999 | Kim et al. |
| 6,020,638 | A | 2/2000 | Kobayashi |
| 6,049,124 | A | 4/2000 | Raiser et al. |
| 6,054,772 | A | 4/2000 | Mostafazadeh et al. |
| 6,064,114 | A | 5/2000 | Higgins, III |
| 6,094,354 | A | 7/2000 | Nakajoh et al. |
| 6,189,591 | B1 | 2/2001 | Ariye et al. |
| 2002/0022301 | A1 | 2/2002 | Kwon et al. |
| 2002/0068424 | A1 | 6/2002 | Hashimoto |
| 2002/0168797 | A1 * | 11/2002 | DiStefano et al. .......... 438/106 |

FOREIGN PATENT DOCUMENTS

| JP | 5-41541 A | 2/1993 |
| JP | 9-213828 A | 8/1997 |
| JP | 11-307587 A | 11/1999 |

* cited by examiner

Primary Examiner—Stephen W. Smoot
(74) Attorney, Agent, or Firm—Volentine Francos & Whitt, PLLC

(57) ABSTRACT

A first adhesive tape is attached to a first major surface of a semiconductor wafer, the semiconductor wafer having a plurality of semiconductor chip regions. Protrusion electrodes are formed on a second major surface of the semiconductor wafer within the plurality of semiconductor chip regions. Portions of the semiconductor wafer located between the plurality of chip regions are removed to form a plurality of semiconductor chips. Intervals between the semiconductor chips are then expanded. Respective first major surfaces of the wiring substrates are coupled to the corresponding second major surfaces of the semiconductor chips by the protrusion electrodes to form preliminarily structures each of which is comprised of the semiconductor chip and the wiring substrate. A second adhesive tape is attached to second major surfaces of the wiring substrates. The first adhesive tape is removed from the semiconductor chips. A resin is applied to gaps between the semiconductor chips and the wiring substrates, and the second adhesive tape is removed from the wiring substrates to form the semiconductor devices.

10 Claims, 14 Drawing Sheets

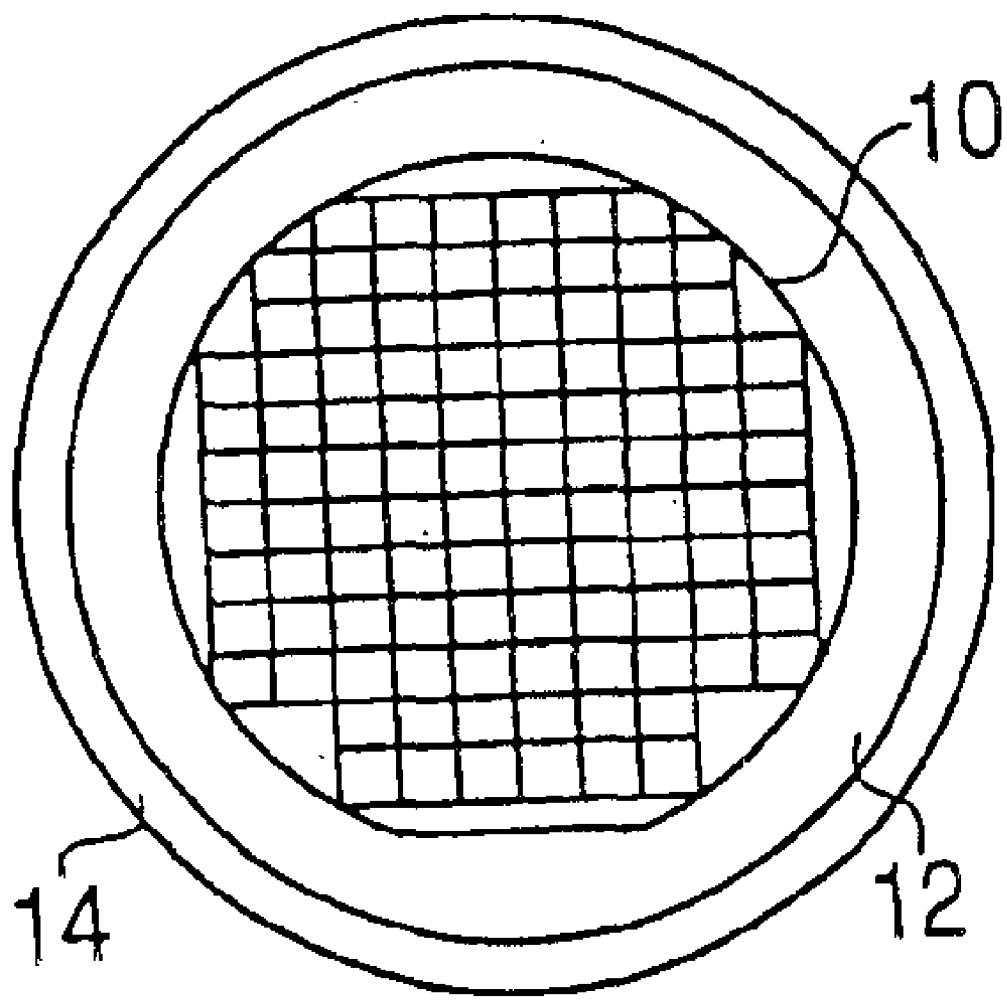

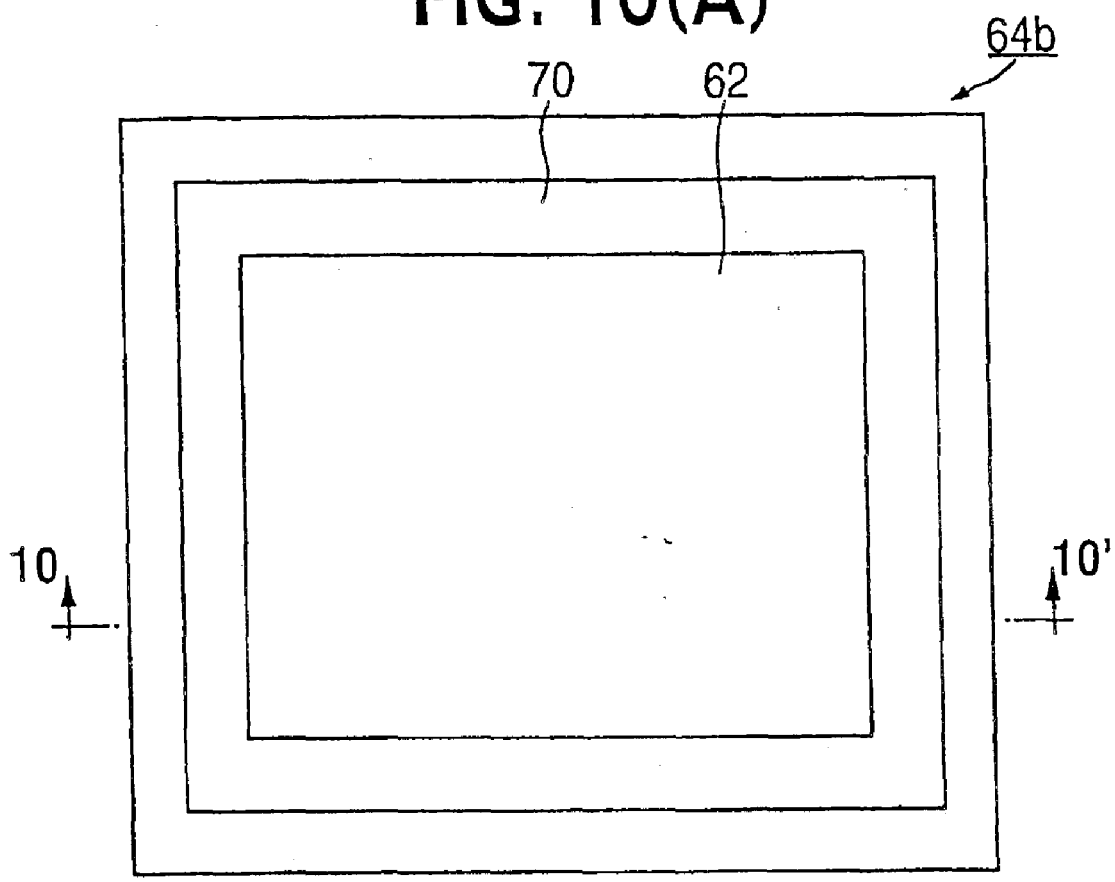
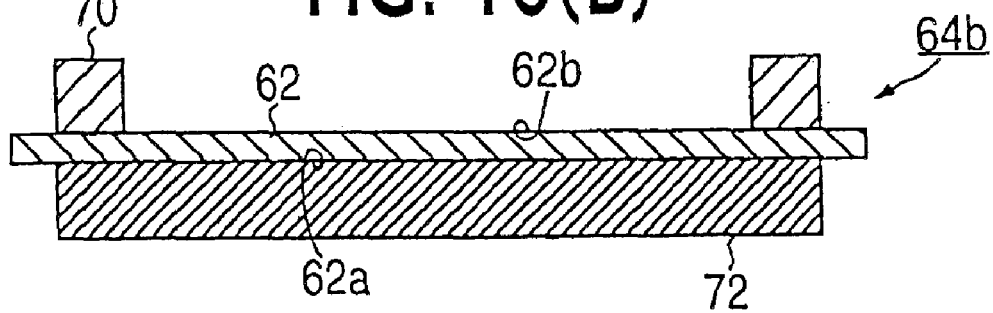

SEMICONDUCTOR PACKAGE WITH A CHIP CONNECTED TO A WIRING SUBSTRATE USING BUMP ELECTRODES AND UNDERFILLED WITH SEALING RESIN

This is a divisional application of application Ser. No. 10/062,433, filed Feb. 5, 2002 now U.S. Pat. No. 6,635,963, which is a divisional application of application Ser. No. 09/497,685, filed Feb. 4, 2000, now U.S. Pat. No. 6,376,278, which are hereby incorporated by reference in their entirely for all purposes.

BACKGROUND OF THE INVENTION

1. Field of the Invention

The present invention relates in general to a method for making a semiconductor device, and more particularly, to a method for making a semiconductor device having a flip chip configuration.

This is a counterpart of Japanese patent application, Ser. No. 94832/1999, filed Apr. 1, 1999.

2. Description of the Related Art

As the integration density of IC chips continues to increase, the overall size of the IC chips tends to increase as well. On the other hand, as high density assembly of devices is the norm, it is still highly desirable that the packages for housing the increasingly larger IC chips be as small and thin as possible.

To this end, a semiconductor package called a "chip scale package" or "chip size package" (CSP) has been recently developed. The CSP is formed of a size which is similar to that of the IC chip.

A flip chip semiconductor device is one of the package types used to obtain a CSP configuration. The flip chip semiconductor device has a semiconductor chip and a package substrate which faces an active surface of the semiconductor chip and couples to the chip through bump electrodes formed on the active surface of the chip. The flip chip semiconductor device is mounted to a substrate, e.g., a printed circuit board.

Many manufacturing steps are needed to obtain the flip chip semiconductor device. Therefore, a manufacturing time period becomes long and a manufacturing cost (an assembling cost) tends to increase.

A need exists for an improved method for making a semiconductor device, and more specifically for an improved method for making a semiconductor device having a flip chip configuration.

SUMMARY OF THE INVENTION

It is an object of the present invention to provide a method for making a semiconductor device that may reduce manufacturing costs.

It is an object of the present invention to provide a method for making a semiconductor device that may reduce manufacturing steps.

It is another object of the present invention to provide a method of making a semiconductor device that may reduce a manufacturing time period.

According to one aspect of the present invention, for achieving the above object, there is provided a method for making a semiconductor device which includes attaching a first adhesive tape onto a first major surface of a semiconductor wafer, and wherein the semiconductor wafer has a plurality of semiconductor chip regions; forming protrusion electrodes on a second major surface of the semiconductor wafer within the plurality of semiconductor chip regions; removing portions of the semiconductor wafer located between the plurality of chip regions to form a plurality of semiconductor chips; expanding intervals between the semiconductor chips; coupling respective first major surfaces of wiring substrates to corresponding second major surfaces of the semiconductor chips by protrusion electrodes to form preliminarily structures each of which is comprised of the semiconductor chip and the wiring substrate; attaching a second adhesive tape onto second major surfaces of the wiring substrates; removing the first adhesive tape from the semiconductor chips; applying a resin to gaps between the semiconductor chips and the wiring substrates; and removing the second adhesive tape from the wiring substrates to form the semiconductor devices.

The above and further objects and novel features of the invention will more fully appear from the following detailed description, appended claims and the accompanying drawings.

BRIEF DESCRIPTION OF THE DRAWINGS

FIG. 3 is a plan view of FIG. 1(A).

FIG. 10(A) is a plan view from an external terminal surface 62b side, which shows a resin sealed intermediate structure 64b.

FIG. 10(B) is a cross sectional view of the semiconductor device of FIG. 10(A) taken along the line 10-10'.

DETAILED DESCRIPTION OF THE PREFERRED EMBODIMENTS

Figure 1A:
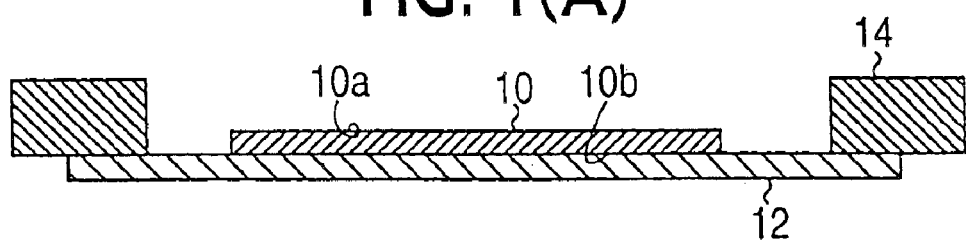
FIGS. 1(A) through (D) are process diagrams showing a method for making a semiconductor device according to a first preferred embodiment of the present invention.

A method for making a semiconductor device according to the present invention will be explained hereinafter with reference to the figures.

The various configuration, sizes, and positions shown in figures are rough outlines that are intended to explain the present invention. However, characteristics such as numerical values and materials which are described later are merely examples. Therefore, the figures are not intended as a definition of the limits of the present invention.

In order to simplify explanations, like elements are given like or corresponding reference numerals through this specification and figures. Thus, dual explanations of the same elements are avoided.

First Preferred Embodiment

FIGS. 1(A) through (D) and FIGS. 2(A) through (C) are process diagrams showing a method for making a semiconductor device according to a first preferred embodiment of the present invention. FIG. 3 is a plan view of FIG. 1(A).

A method for making a semiconductor device according to the first preferred embodiment of the present invention will be explained hereinafter with reference to these figures.

A flip chip configuration is used for the semiconductor device to obtain "a chip size package".

Step (a)

First, a back surface 10b of a silicon wafer 10 is fixed on an adhesive tape 12 (refer to FIG. 1(A)). The adhesive tape 12 has a heat resisting property. An edge portion of the adhesive tape 12 is fixed to a tool having a ring form, i.e., a wafer ring 14 (refer to FIG. 3)).

A plurality of silicon chip regions are formed on and arranged in a front surface 10a of the silicon wafer 10. The front surface 10a is also called "an active surface" or "an electric circuit surface". Electric circuits (circuit patterns) are formed on each of the silicon chip regions. Electrodes for electrically coupling to an external device are formed on a periphery of each silicon chip region. The electrodes are comprised of, for example, pads (not shown in figures).

Step (b)

Figure 1B:
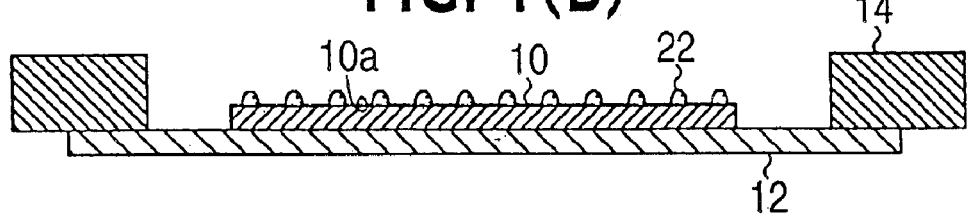
Figure 1C:
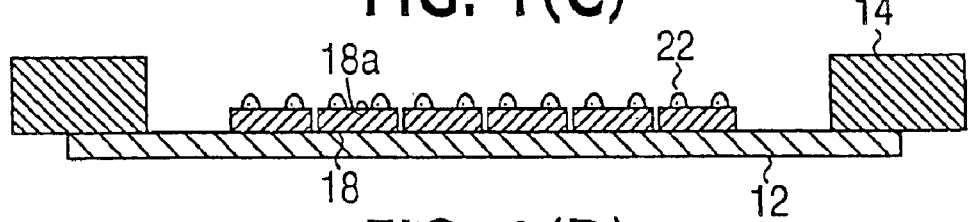

Next, bumps 22 are formed on the electrodes which are formed on the front surface 10a of the silicon wafer 10, respectively (refer to FIG. 1(B)). That is, a bump bonding is applied to the electrodes by using a capillary. The bump 22 is made of, for example, a laminated layer Au/solder/tin or a laminated layer Sn/Pb. The bump 22 may be also made of, for example, Au or Sn.

Step (c)

The silicon wafer 10 is subjected to a dicing process. Thus, the silicon wafer 10 is separated into pieces of silicon chips 18. The silicon wafer 10 is separated at a predetermined position by using a dicing blade. Each of the separated silicon chips 18 has a predetermined size. The electric circuit, the electrode and the bump 22 are provided on the front surfaces 18a of the respective silicon chips 18.

Step (d)

Figure 1D:
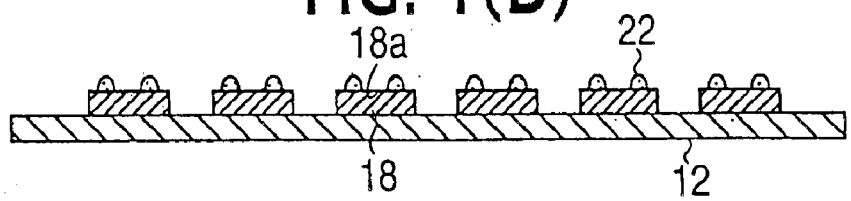

Next, the adhesive tape 12 is stretched so that distances between the silicon chips 18 increase (refer to FIG. 1(D)). Since these distances become large, a wiring substrate 28 having a size which is relatively larger than that of the silicon chip 18 may be easily attached to the silicon chip 18 in the next step. The wiring substrate 28 is also called "a package substrate".

Step (e)

Figure 2A:
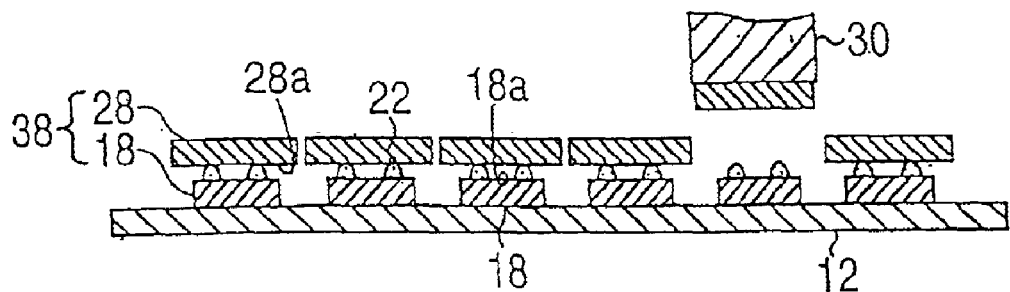
FIGS. 2(A) through 2(C) are process diagrams showing a method for making a semiconductor device according to a first preferred embodiment of the present invention.
Figure 2B:
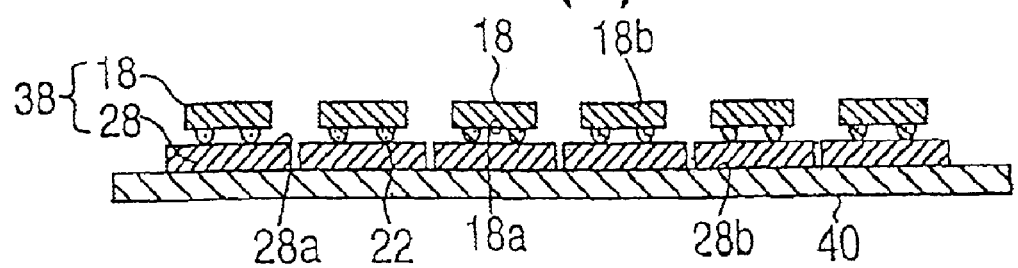

Next, the adhesive tape 12 on which the silicon chips 18 are adhered is located on a bonding stage (not shown in FIG. 2(A)). Then, the wiring substrate 28 is transferred and positioned so that an internal terminal surface 28a thereof faces the front surface 18a of the corresponding silicon chip 18 by using a bonding tool 30. The wiring substrate 28 is made of, for example, a glass epoxy, a ceramic, a polyimide, or the like and has the size which is relatively larger than that of the silicon chip 18.

Next, internal electrodes formed on the internal terminal surface 28a are aligned with the corresponding bumps 22. Thereafter, the wiring substrate 28 is compression-bonded to the silicon chip 18. That is, the wiring substrate 28 is attached to the silicon chip 18, or in other words the silicon chip 18 is mounted on the wiring substrate 18. As a result, a preliminary semiconductor device structure 38 (hereinafter a preliminary structure 38) is obtained which is defined by the silicon chip 18 and the wiring substrate 28 attached to the silicon chip 18.

Step (f)

Next, an adhesive tape 40 is adhered on external terminal surfaces 28b of the wiring substrates 28. The adhesive tape 40 has a heat resisting property. Then, the adhesive tape 12 adhered on back surfaces 18b of the silicon chips 18 is removed (refer to FIG. 2(B)). Therefore, the internal terminal surfaces 28a of the wiring substrates 28 do not face any adhesive tapes and are exposed.

Step (g)

Figure 2C:
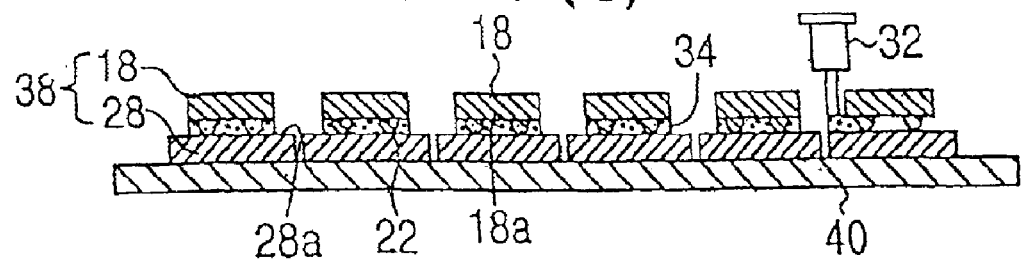

Next, as illustrated in FIG. 2(C), an appropriate amount of resin 34 is flowed into a space between the internal terminal surface 28a of the wiring substrate 28 and the front surface 18a of the silicon chip 18 by using a resin dispenser 32.

In this case, the resin 34 is flowed into the space from a periphery of the wiring substrate 28, wherein the periphery of the wiring substrate 28 is a region where the silicon chip 18 is not overlapped with the wiring substrate 28. The distance between an edge of the silicon chip 18 and an edge of the wiring substrate 28 is set in the range of 0.5 mm to 2.0 mm.

Thereafter, the resin 34 is hardened by applying heat.

As a result, the semiconductor device which is sealed with the resin 34 is obtained.

Thereafter, solder balls which function as external terminals may be formed on the external terminal surface 28b of the wiring substrate 28 if necessary. Reliability for connecting the semiconductor device to a motherboard may be improved by providing the solder balls.

As described above, since the adhesive tape 40 is adhered to the wiring substrates 28 of the preliminary structures 38 in the process step (f), the preliminary structures 38 may be processed and transferred all at once.

In one of the conventional process steps, silicon chips are transferred to a bonding stage one by one and then a wiring substrate is connected to the silicon chip to obtain a preliminary structure. The first preferred embodiment of the present invention may avoid such individually transferring of the silicon chips. Therefore, a manufacturing time period and a manufacturing cost may be reduced.

Second Preferred Embodiment

Figure 4:
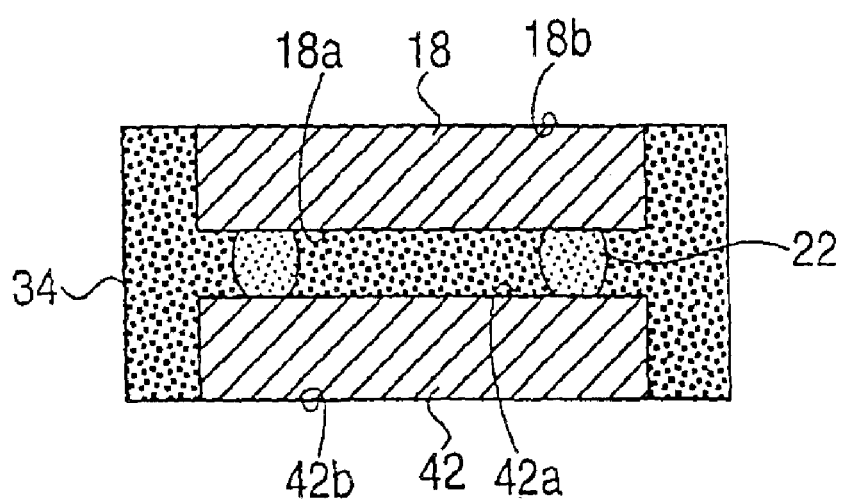
FIG. 4 is a cross sectional view showing a semiconductor device according to a second preferred embodiment of the present invention.

FIG. 4 is a cross sectional view showing a semiconductor device according to a second preferred embodiment of the present invention.

The semiconductor device is made up of a silicon chip 18 and a wiring substrate 42. The size of the silicon chip 18 and the size of the wiring substrate 42 are substantially the same.

The silicon chip 18 has a front surface 18a on which electrodes are formed. The wiring substrate 42 has an internal terminal surface 42a on which internal electrodes are formed. The front surface 18a and the internal terminal surface 42a face each other. The electrodes of the silicon chip 18 are connected to the internal electrodes of the wiring substrate 42 through bumps 22.

A gap between the silicon chip 18 and the wiring substrate 42 is filled with a resin 34. Side surfaces of the silicon chip 18 and the wiring substrate 42 are covered with the resin 34. A back surface 18b of the silicon chip 18 which is opposite to the front surface 18a, and a external terminal surface 42b of the wiring substrate 42 which is opposite to the internal terminal surface 42a, are exposed.

Next, a method for manufacturing a semiconductor device according to a second preferred embodiment of the present invention will be explained hereinafter with reference to FIG. 5.

Figure 5A:
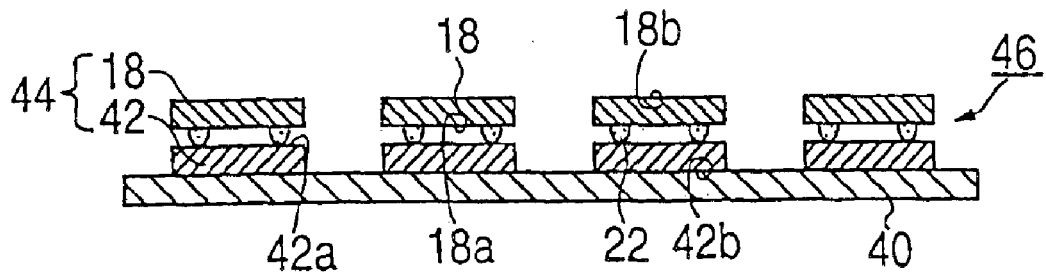
FIGS. 5(A) through (C) are process diagrams showing a method for making a semiconductor device according to a second preferred embodiment of the present invention.
Figure 5B:
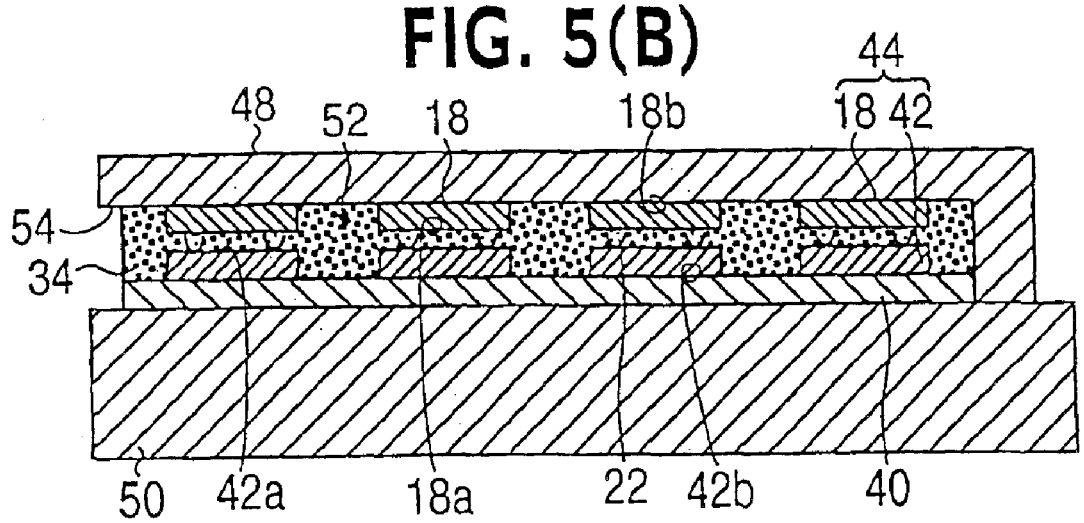
Figure 5C:
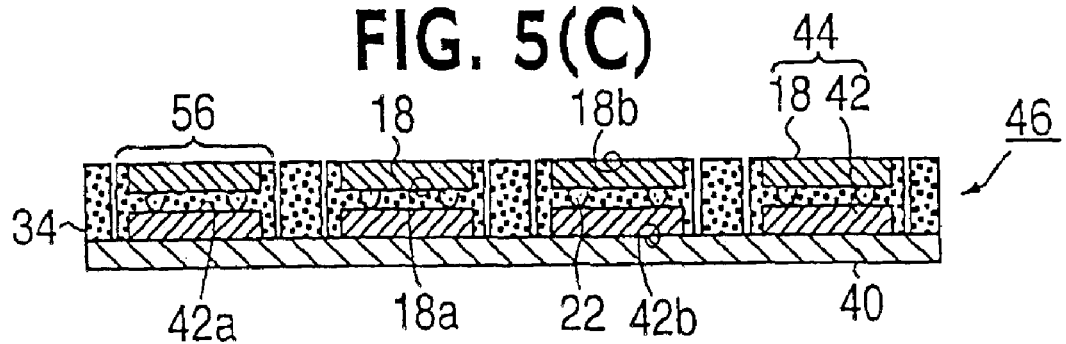

FIGS. 5(A) through (C) are process diagrams showing a method for making a semiconductor device according to the second preferred embodiment of the present invention.

In the second preferred embodiment, steps (h) and (i) which are described below are executed after steps (a) through (e) (and if necessary step (f) which are explained in the first preferred embodiment have been done.

Therefore, explanations with respect to the steps (a) through (f) are omitted here. However, wiring substrates 42 of the second preferred embodiment has a size which is different than that of the wiring substrates 28 of the first preferred embodiment.

Turning to FIG. 5(A), a state in which the steps (a) through (f) have been done is shown.

The external terminal surfaces 42b of the wiring substrates 42 are adhered on the adhesive tape 40. The internal electrodes formed on the internal terminal surfaces 42a of the wiring substrate 42 are connected to the electrodes formed on the front surfaces 18a of the silicon chip 18 through the bumps 22.

This combination of the silicon chip 18 and the wiring substrate 42 attached to the silicon chip 18 is called a preliminary semiconductor device structure 44 (hereinafter a preliminary structure 44) throughout this embodiment. Furthermore, a state in which the preliminary structure 44 is attached on the adhesive tape 40 is called an intermediate semiconductor device structure 46 (hereinafter an intermediate structure 46) throughout this embodiment.

Step (h)

Next, as shown in FIG. 5(B), the intermediate structure 46 is held by an upper molding die 48 and a lower molding die 50.

The upper molding die 48 has a concave portion which has a rectangular parallelepiped shape or a wafer like shape. The lower molding die 50 has a board like configuration. A cavity 52 which is capable of housing the intermediate structure 46 is obtained by combining the upper molding die 48 with the lower molding die 50.

Next, the resin 34 is injected into the cavity 52 from a resin inject port 54 formed in the upper molding die 48.

Thereafter, the resin 34 is hardened by applying heat. When a resin having thermosetting property and quick harden property is used as the resin 34, such resin will harden in several tens of minutes.

As a result, the intermediate structure 46 which is sealed with the resin 34 is obtained (refer to FIG. 5(C)).

Step (i)

Next, device regions 56 each of which includes the preliminary structure 44 are defined.

Then, the intermediate structure 46 is subjected to dicing process so that each of the device regions 56 are cut out. The intermediate structure 46 is separated at a predetermined position by using a dicing blade. Thus, the intermediate structure 46 is separated into pieces of semiconductor devices. Each of the separated semiconductor devices has a predetermined size (refer to FIG. 5(C)).

As described above, since the resin sealing process is executed by using a molding die instead of the resin dispenser, all the preliminary structures 44 may be sealed with the resin at the same time. Therefore, a manufacturing time period may be sharply reduced.

Furthermore, since the wining substrate 42 having a size which is substantially the same size as the silicon chip 18 may be used, it is possible to miniaturize the device. The size of the semiconductor device may be 1.0 mm to 1.6 mm smaller than that of the conventional semiconductor device.

Furthermore, since the dicing process is used for separating the intermediate structure 46, an outer dimension accuracy of the semiconductor device is improved to $\frac{1}{10}$ through $\frac{1}{100}$ of a normal value. (That is, a single dimension accuracy in a substrate manufacturer is ±0.005 mm, however, a dicing accuracy is ±0.005 mm.)

Third Preferred Embodiment

Figure 6A:
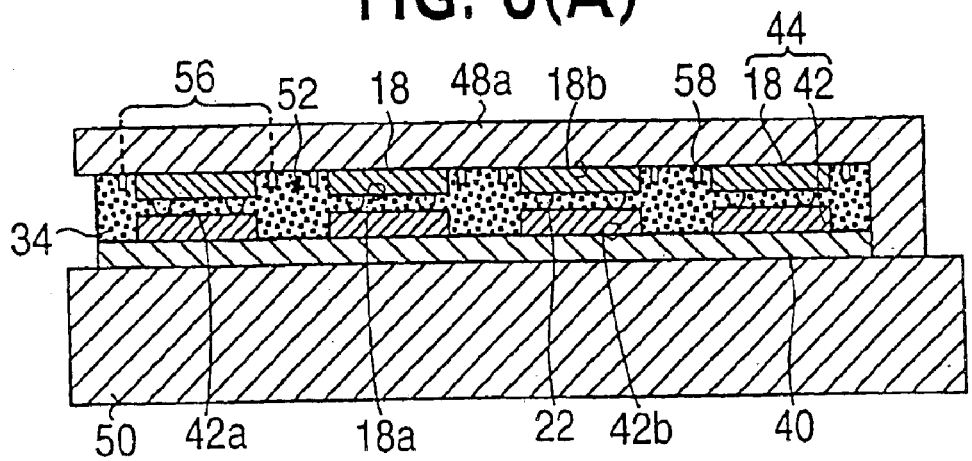
FIGS. 6(A) and (B) are process diagrams showing a method for making a semiconductor device according to a third preferred embodiment of the present invention.

FIGS. 6(A) and (B) are process diagrams showing a method for making a semiconductor device according to a third preferred embodiment of the present invention.

A method for making a semiconductor device according to the third preferred embodiment of the present invention will be explained hereinafter with reference to these figures.

Basically, process steps of the third preferred embodiment are the same as those of the second preferred embodiment. However, in the third preferred embodiment, protrusion structures 58 are provided on the upper molding die 48a or lower molding die 50 in the cavity 52. The protrusion structures 56 are located at boundaries of device regions 56.

FIG. 6(A) shows a state in which the steps (a) through (h) of the second embodiment have been done.

As illustrated in FIG. 6(A), the intermediate structure 46 is held by the upper molding die 48a and the lower molding die 50. The resin 34 is filled in the cavity 52 and is hardened. That is, the intermediate structure 46 which has been sealed with the resin 34 is shown in FIG. 6(A).

In this FIG. 6(A), the protrusion structures 58 is provided on the upper molding die 48a. The protrusion structures 58 are formed at positions in which the preliminary structure 46 to be separated.

Figure 6B:
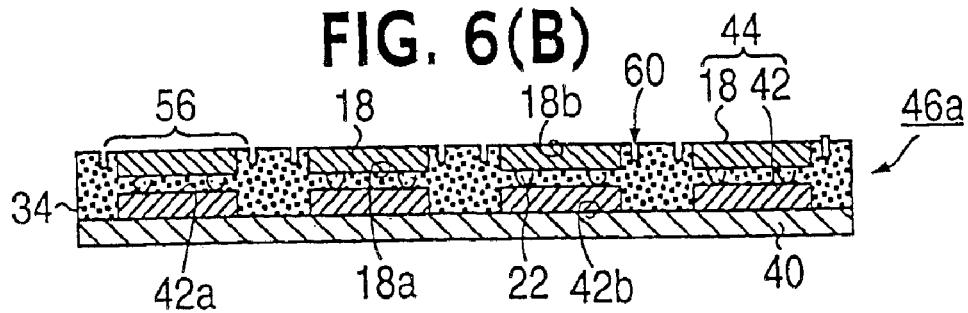

Next, when the upper molding die 48a and the lower molding die 50 are removed from the preliminary structure 46, notches 60 have been formed on the surface of the preliminary structure 46. (The notch is also called "a trench".) These notches 60 are formed along boundaries between the device regions 56 (refer to FIG. 6(B)).

The intermediate structure 46a may be manually separated along the notches by hand. This means that the intermediate structure 46a is easily separated into the individual semiconductor devices after adhesive tape 40 is removed.

Furthermore, it is possible to reduce a manufacturing time period and a manufacturing cost.

Finally, the semiconductor device as shown in FIG. 4 is obtained.

Fourth Preferred Embodiment

Figure 7:
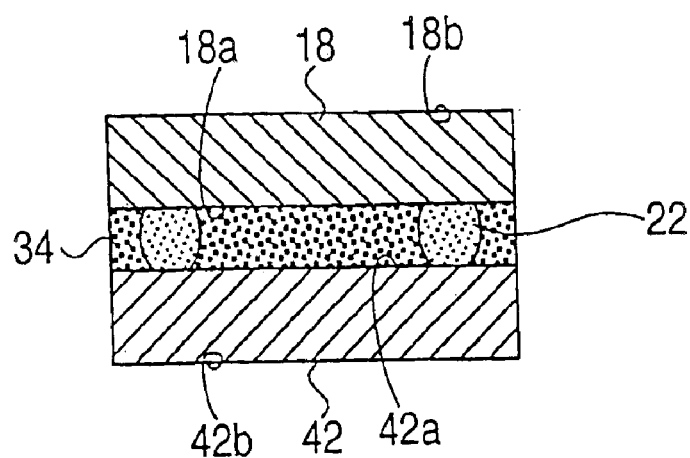
FIG. 7 is a cross sectional view showing a semiconductor device according to a fourth preferred embodiment of the present invention.

FIG. 7 is a cross sectional view showing a semiconductor device according to a fourth preferred embodiment of the present invention.

The semiconductor device has a structure which is similar to that of the semiconductor device of the second preferred embodiment. The difference between the semiconductor device shown in FIG. 7 and the second preferred embodiment resides in the sides of the wiring substrate 42. That is, the sides of the wiring substrate 42 shown in FIG. 7 are not covered with the resin 34.

Figure 8A:
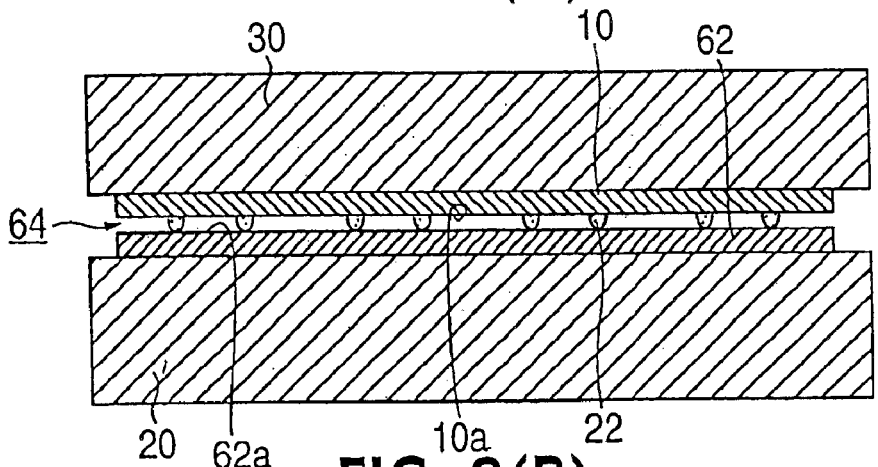
FIGS. 8(A) through (C) are process diagrams showing a method for making a semiconductor device according to a fourth preferred embodiment of the present invention.
Figure 8B:
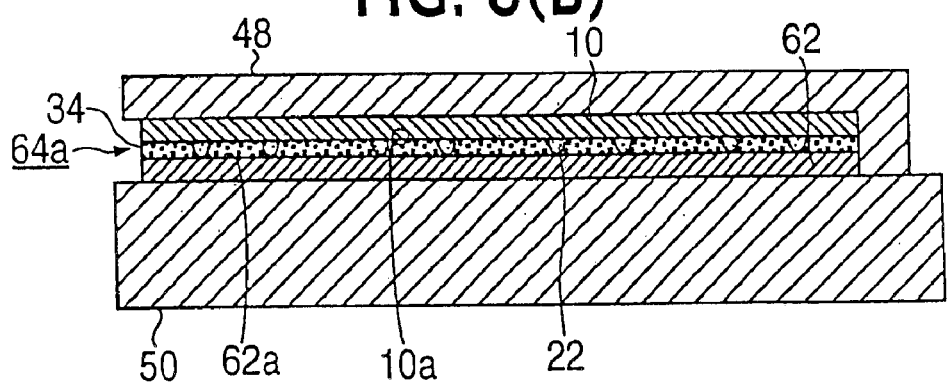
Figure 8C:
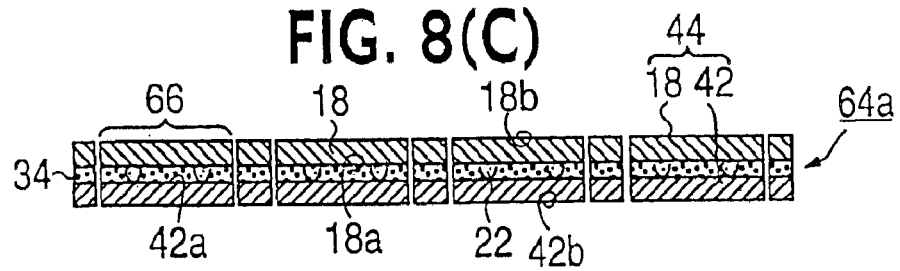

FIGS. 8(A) through (C) are process diagrams showing a method for making a semiconductor device according to the fourth preferred embodiment of the present invention.

A method for making a semiconductor device according to the fourth preferred embodiment of the present invention will be explained hereinafter with reference to these figures.

First, bumps 22 are formed on electrodes which are provided on a front surface 10a of a silicon wafer 10, respectively. The front surface 10a is called also "an active surface" or "an electric circuit surface".

Next, a wiring substrate 62 is located on a bonding stage 20 so that an internal terminal surface 62a faces upward.

Then, the silicon wafer 10 having the bumps 22 formed thereon is transferred over to the bonding stage 20 by a bonding tool 30 so that the front surface 10a faces the internal terminal surface 62a.

Thereafter, the bumps 22 are compression-bonded to the internal terminals. That is, the wiring substrate 62 is attached to the silicon wafer 10, or in other words, the silicon wafer 10 is mounted on the wiring substrate 62.

As a result, an intermediate semiconductor device structure 64 (hereinafter an intermediate structure 64) is obtained which is defined by the silicon wafer 10 and the wiring substrate 62 attached to the silicon wafer 10 (refer to FIG. 8(A)).

The wiring substrate 62 will be separated into individual wiring substrates 42 in a later process step. Therefore, regions for respective wiring substrates 42 are defined on the wiring substrate 62. The defined regions correspond to silicon chips 18 which will be obtained in the later separating process step.

Next, the intermediate structure 64 is held by an upper molding die 48 and a lower molding die 50. A resin 34 is flowed into a gap between the silicon wafer 10 and the wiring substrate 62 and then the resin 34 is hardened (refer to FIG. 8(B)).

Thereafter, when the upper molding die 48 and the lower molding die 50 are removed, the intermediate structure 64a which is sealed with the resin 34 is obtained.

Next, device regions 66 each of which includes the preliminary structure 44 are defined.

Then, the intermediate structure 64a is subjected to dicing process so that each of the device regions 66 are cut out. The intermediate structure 64a is separated at boundaries between the semiconductor regions 66 by using a dicing blade. Thus, the silicon wafer 10 is separated into pieces of semiconductor chips 18 and the wiring substrate 62 is separated into the wiring substrates 42. As a result, the semiconductor device as shown in FIG. 7 is obtained.

As described above, since the resin sealing process is executed by using a molding die instead of the resin dispenser, the resin may be flowed into the gap once. Therefore, a manufacturing time period may be sharply reduced.

Furthermore, since the wiring substrate 42 having a size which is substantially the same size of the silicon chip 18 may be used, it is possible to miniaturize the device.

The size of the semiconductor device may be 1.0 mm to 2.6 mm smaller than that of the conventional semiconductor device.

Furthermore, since the dicing process is used for separating the intermediate structure 64a, an outer dimension accuracy of the semiconductor device is improved.

Fifth Preferred Embodiment

This embodiment relates to a method for separating the resin sealed intermediate structure 46 and 64a as explained before (the second and the fourth preferred embodiment) into the semiconductor devices.

In this embodiment, a case of separating the intermediate structure 64a into the semiconductor devices is explained as an example.

Figure 9A:
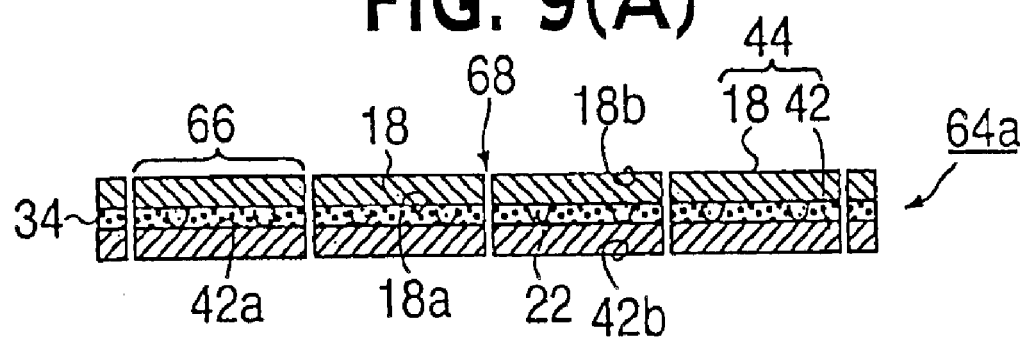
FIG. 9(A) is one of process diagrams showing a method for making a semiconductor device according to a fifth preferred embodiment of the present invention.

FIG. 9(A) is one of process diagrams showing a method for making a semiconductor device according to a fifth preferred embodiment of the present invention. That is, FIG. 9(A) is a cross sectional view showing the intermediate structure 64a just after the intermediate structure 64a is separated by a dicing blade.

In this embodiment, intervals between device regions 66 are set to distances which are substantially equal to dicing width 68 (cutting line 68). That is, the device regions 66 are separated by a distance from each other, wherein the distance is equal to the dicing width 68. Since most portions after dicing diced may be used for the semiconductor device, wasted portions between the device regions 66 which do not function semiconductor devices may be reduced.

Figure 9B:
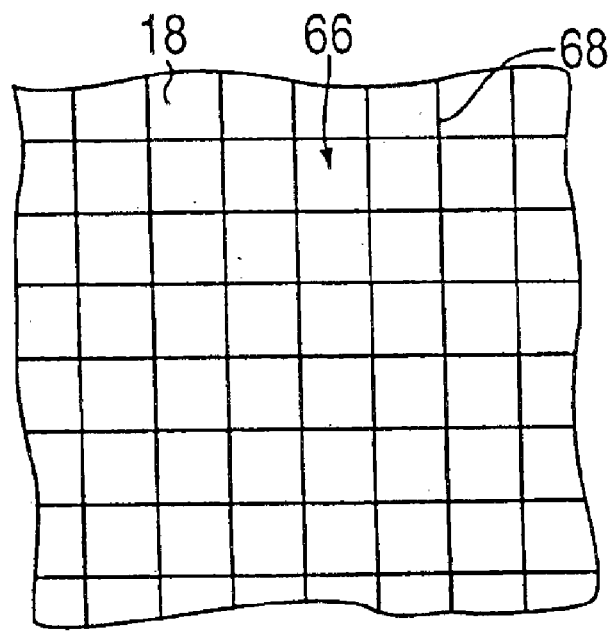
FIG. 9(B) is a plan view showing an intermediate structure 64a from a silicon wafer 10 side before dicing.

FIG. 9(B) is a plan view showing the intermediate structure 64a from the silicon wafer 10 side before dicing.

Each of the device regions 66 is arranged in a matrix form so that the device regions 66 are separated by the dicing width 68 (cutting line 68).

As described above, the device regions 66 are arranged at minimum intervals. Therefore, a lot of products may be yields from one silicon wafer 10.

Furthermore, since it is not necessary to remove the wasted portions, manufacturing steps may be reduced.

Sixth Preferred Embodiment

This embodiment relates to a method of sealing the intermediate structure 64 in the fourth preferred embodiment.

In this embodiment, when the intermediate structure 64 is sealed with the resin, a resin structure 70 is also formed on the external terminal surface 62b of the wiring substrate 62.

FIG. 10(A) is a plan view from the external terminal surface 62b side, which shows the resin sealed intermediate structure 64b.

FIG. 10(B) is a cross sectional view of the semiconductor device of FIG. 10(A) taken along the line 10-10'. However, in FIG. 10(B), the resin (such as resin 34 of FIG. 8(B)) formed on the internal terminal surface 62a of the wiring substrate 62 and the silicon wafer (such as wafer 10 of FIG. 8(B)) bonded to the internal electrodes of the wiring substrate 62 through the bumps 22 are illustrated together as a resin forming part 72.

Now, assuming that a resin deposition structure such as the resin forming part 72 is formed on only one side of the wiring substrate 62.

In a resin seal step, the resin of high temperature is flowed onto the internal terminal surface 62a. After that, contraction stress occurs during the resin is cooled to room temperature. The wiring substrate 62 is bent by the contraction stress. (The shape of the wiring substrate is changed.)

As explained above, there is a possibility that the wiring substrate 62 is bent if the resin 34 is formed on only one side of the wiring substrate 62.

In this preferred embodiment, a resin structure 70 is also formed on the external terminal surface 62b when the resin seal step is executed. Therefore, the contraction stress described above may be canceled and thus the wiring substrate 62 is not bent.

Furthermore, the resin structure 70 has a frame structure which surrounds the resin forming part 72. Since the width and the thickness of the frame structure is set to an appropriate value, the contraction stress is called out.

Seventh Preferred Embodiment

Like the sixth embodiment, this seventh embodiment relates to a method for sealing the intermediate structure 64 in the fourth preferred embodiment.

The seventh embodiment differs from the sixth in that the a resin structure 70a has a lattice configuration.

Figure 11A:
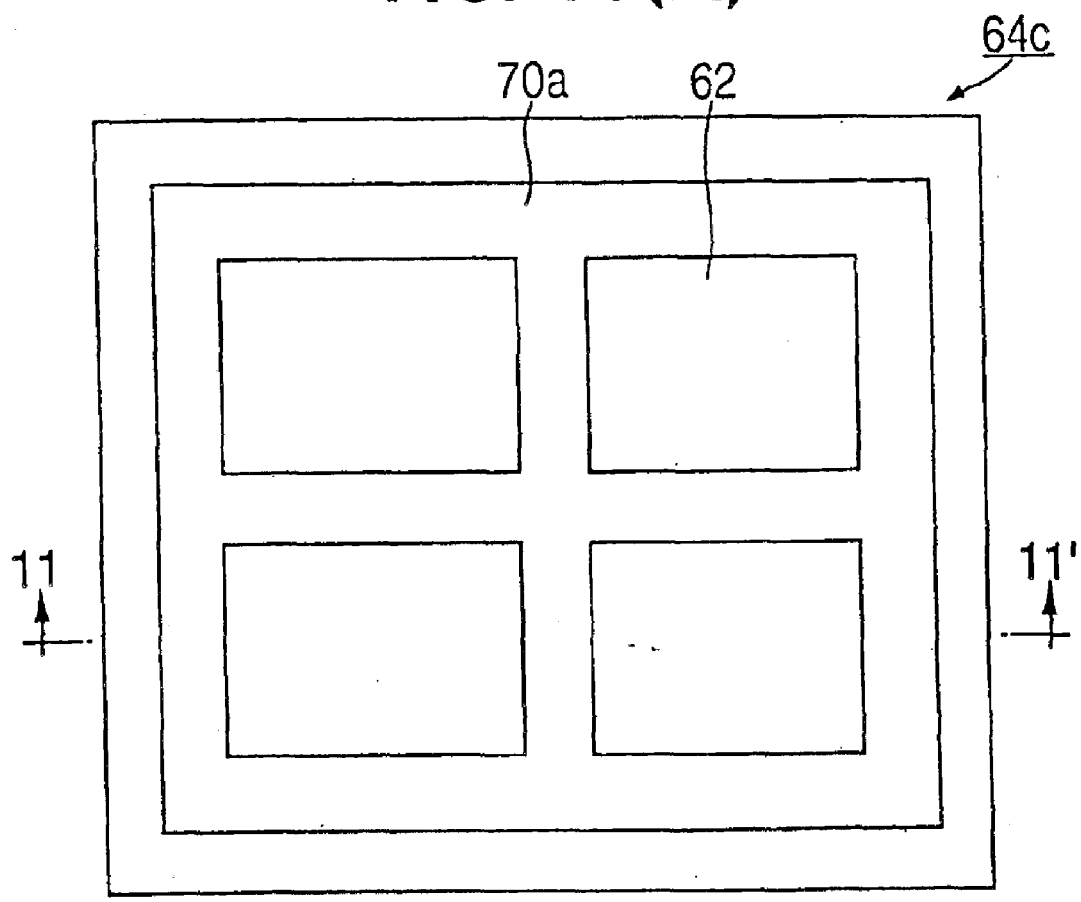
FIG. 11(A) is a plan view from an external terminal surface 62b side, which shows a resin sealed intermediate structure 64c.

FIG. 11(A) is a plan view from the external terminal surface 62b side, which shows the resin sealed intermediate structure 64c.

Figure 11B:
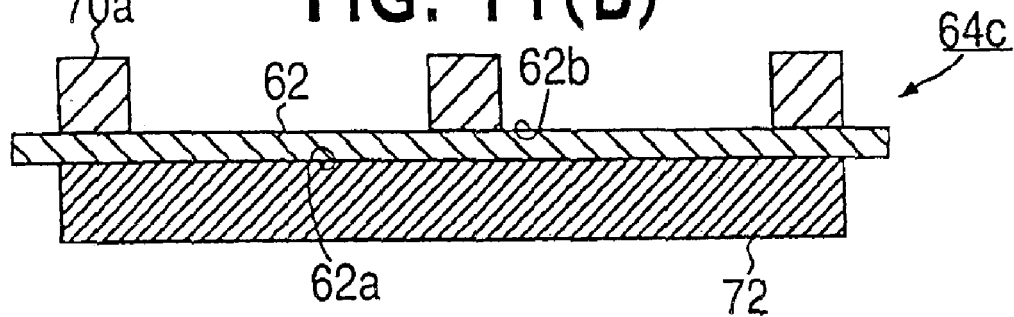
FIG. 11(B) is a cross sectional view of the semiconductor device of FIG. 11(A) taken along the line 11-11'.

FIG. 11(B) is a cross sectional view of the semiconductor device of FIG. 11(A) taken along the line 11-11'.

As illustrated in FIGS. 11(A) and (B), the external terminal surface 62b is divided into four regions by the resin structure 70a having the lattice configuration. This means that the frame strength increases. Therefore, a high stress cancellation effect is obtained. Furthermore, this structure also may reinforce the intermediate structure 64c.

The shape of the resin structure 70a is not limited to this structure. Other shapes may be applied to the resin structure 70a.

Eighth Preferred Embodiment

This embodiment also relates to a method for sealing the intermediate structure 64 in the fourth preferred embodiment.

In this embodiment, the resin structure 70b is formed outside of the resin forming part 72.

Figure 12A:
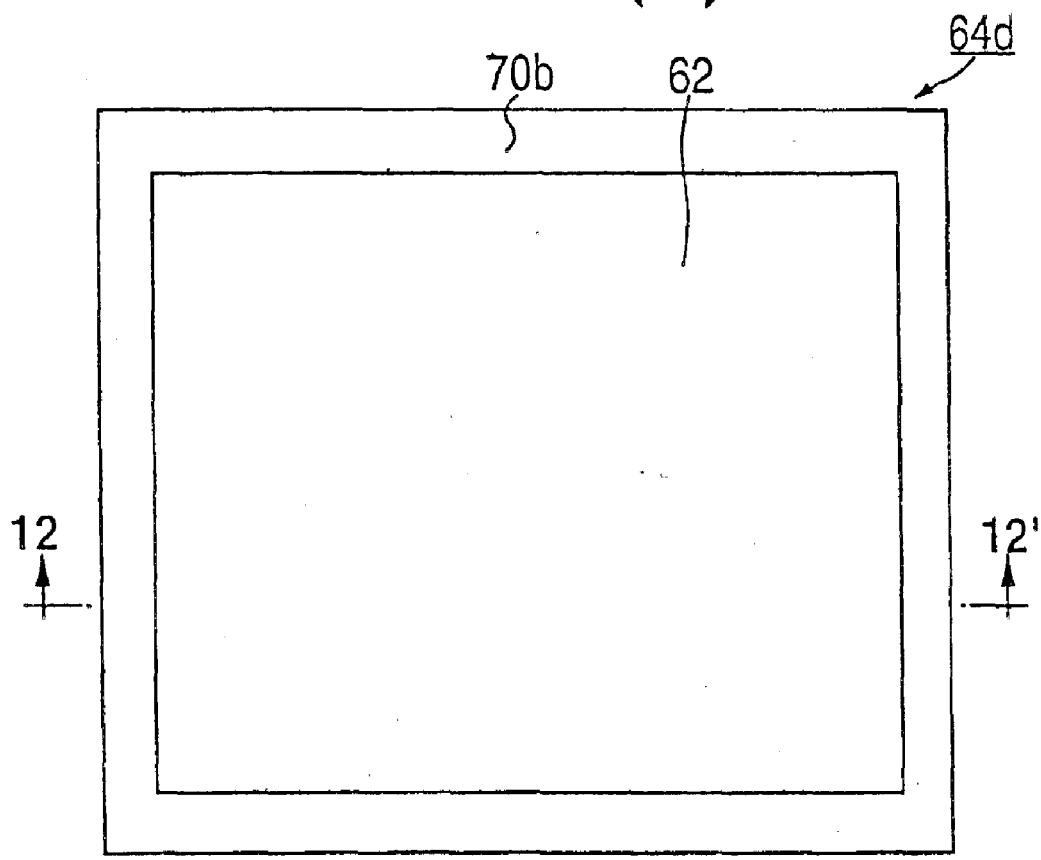
FIG. 12(A) is a plan view from an external terminal surface 62b side, which shows a resin sealed intermediate structure 64d.

FIG. 12(A) is a plan view from the external terminal surface 62b side, which shows the resin sealed intermediate structure 64d.

Figure 12B:
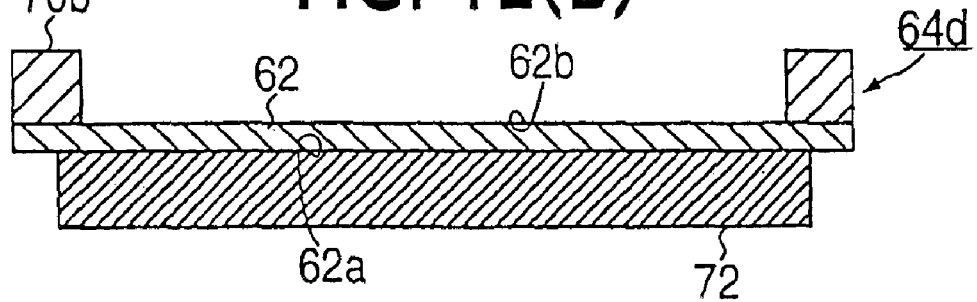
FIG. 12(B) is a cross sectional view of the semiconductor device of FIG. 12(A) taken along the line 12-12'.

FIG. 12(B) is a cross sectional view of the semiconductor device of FIG. 12(A) taken along the line 12—12'.

As illustrated in FIGS. 12(A) and (B), the resin structure 70b is formed at a position which surrounds the resin forming part 72. Therefore, a maximum region which is used for formation of the semiconductor devices may be obtained.

Ninth Preferred Embodiment

This embodiment relates to a method for separating the intermediate structure 64 in the fourth preferred embodiment.

In the sixth thorough the eighth embodiments, a variety of resin structures 70 are formed during the resin seal step. However, the resin structure 70 must be removed from a product region 78 before a resin sealed intermediate structure 64e is separated into the semiconductor devices. Therefore, in the ninth preferred embodiment, a notch 74 is formed on the resin forming part 72 and a notch 76 is formed on the wiring substrate 62. The notches 74 and 76 are located at just inside of the resin structure 70.

Figure 13A:
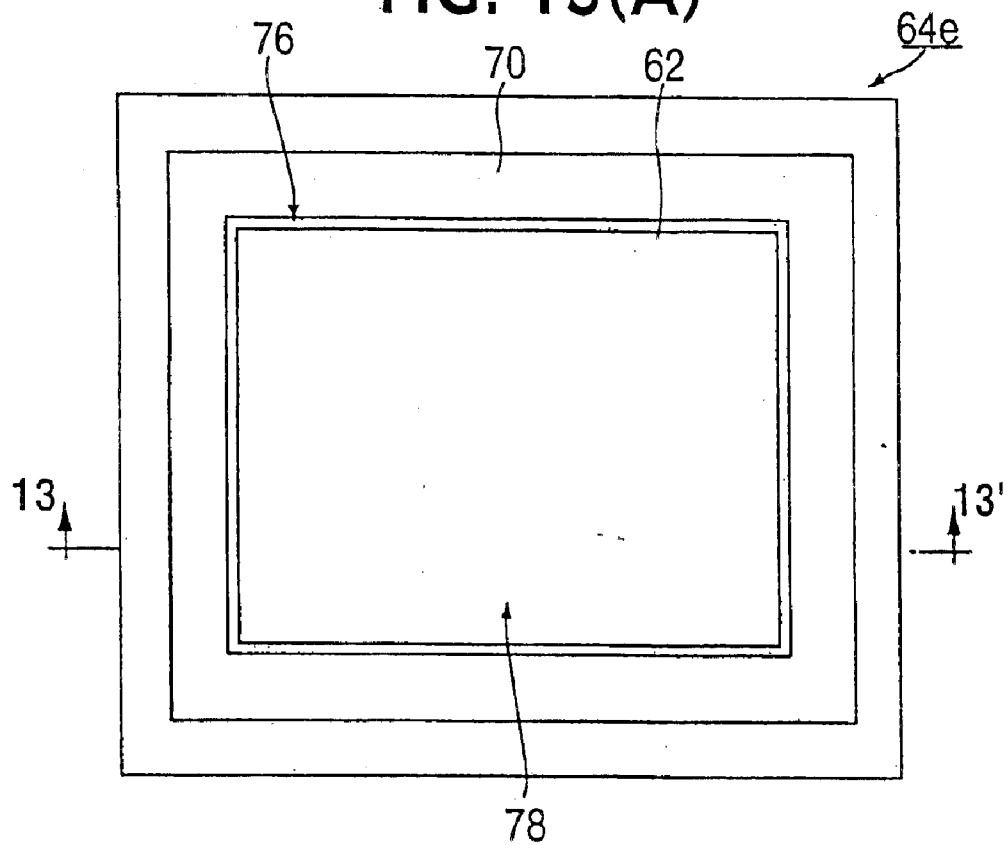
FIG. 13(A) is a plan view from an external terminal surface 62b side, which shows a resin sealed intermediate structure 64e.

FIG. 13(A) is a plan view from the external terminal surface 62b side, which shows the resin sealed intermediate structure 64e.

Figure 13B:
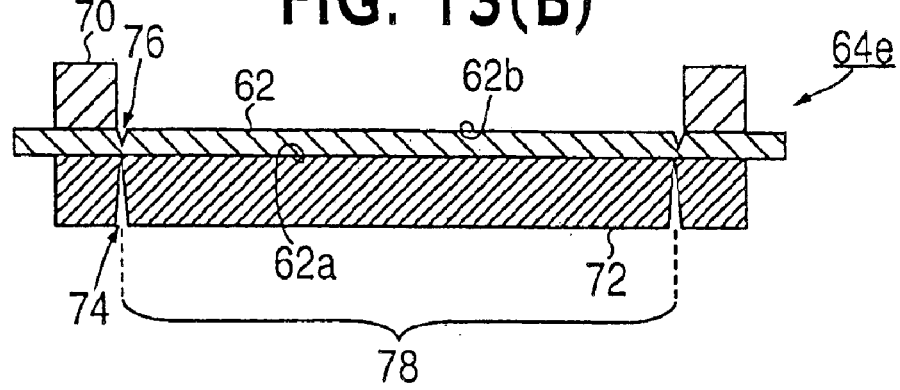
FIG. 13(B) is a cross sectional view of the semiconductor device of FIG. 13(A) taken along the line 13-13'.

FIG. 13(B) is a cross sectional view of the semiconductor device of FIG. 13(A) taken along the line 13—13'.

As illustrated in FIG. 13(A), the notch 76 having V shape cross section is formed at just inside the resin structure 70 on the wiring substrate 62. The notch 76 is formed along the inside of the resin structure 70.

The notch 74 having V shape cross section is formed on the resin structure 72 which is opposite to the notch 76.

Since the notches 74 and 76 are provided, the product region 78 which includes device regions 66 may be easily separated from the resin structure 70 by using, for example, a press machine.

The cross section shape of the notch may also be U shaped.

Tenth Preferred Embodiment

This embodiment relates to a notch for separating the product region 78 from the resin structure 70.

Figure 14A:
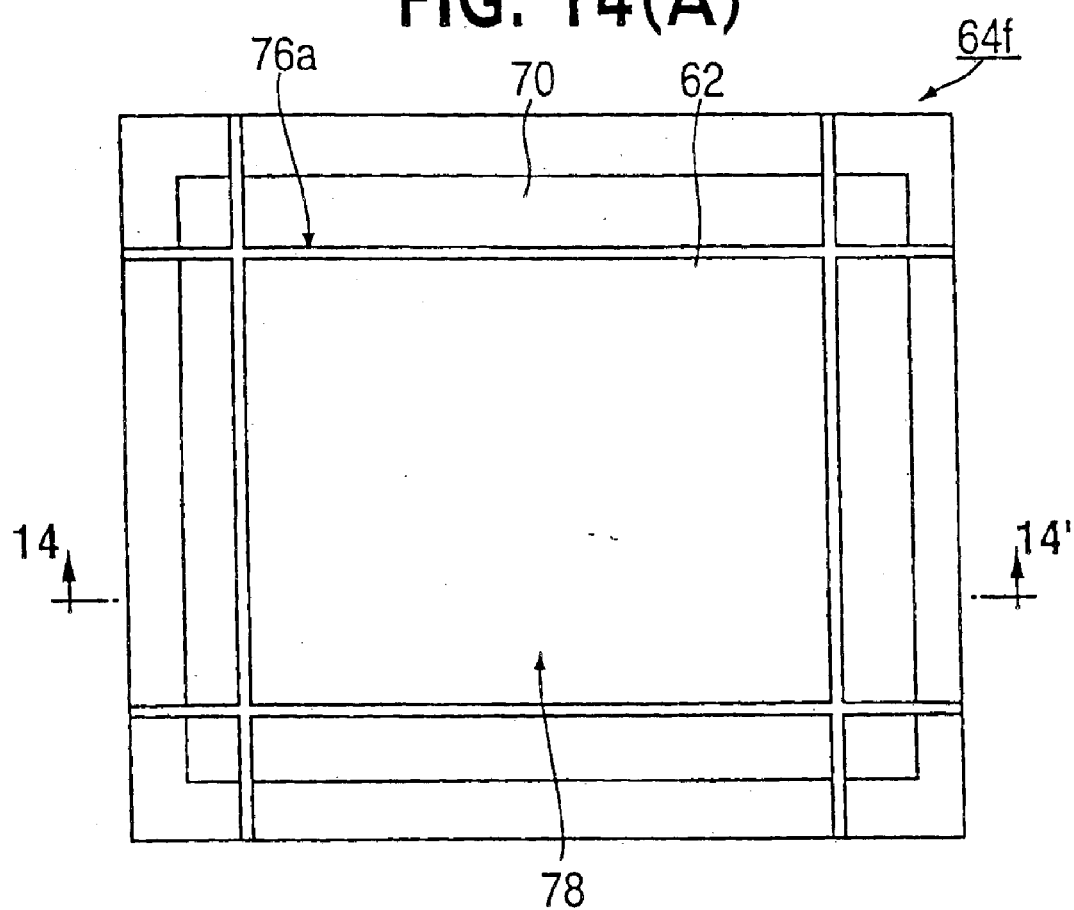
FIG. 14(A) is a plan view from an external terminal surface 62b side, which shows a resin sealed intermediate structure 64f.

FIG. 14(A) is a plan view from the external terminal surface 62b side, which shows the resin sealed intermediate structure 64f.

Figure 14B:
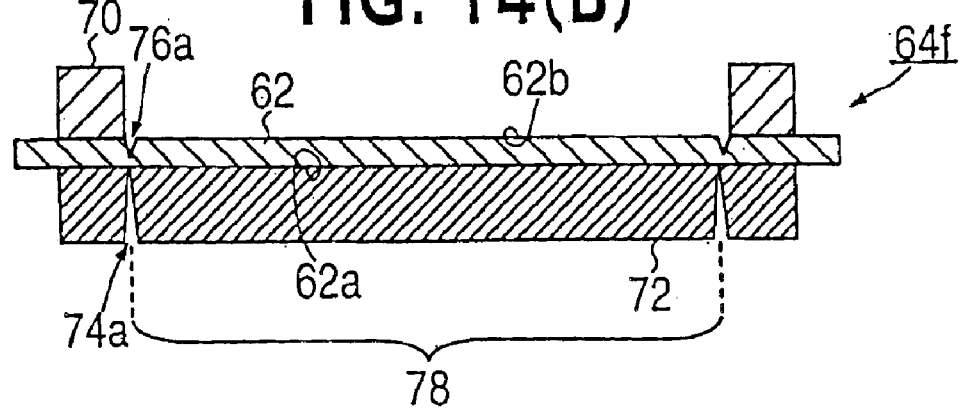
FIG. 14(B) is a cross sectional view of the semiconductor device of FIG. 14(A) taken along the line 14-14'.

FIG. 14(B) is a cross sectional view of the semiconductor device of FIG. 14(A) taken along the line 14-14.

As illustrated in FIGS. 14(A) and (B), the notch 76a having V shape cross section is formed at just inside the resin structure 70 on the wiring substrate 62. The notch 76a is also formed so as to extend to edges of the wiring substrate 70.

The notch 74a having V shape cross section is formed on the resin structure 72 which is opposite to the notch 76a.

Since the notches 74a and 76a are provided, the product region 78 may be easily separated from the resin structure 70 using a relatively small force such as by hand.

The cross section shape of the notch may also be U shaped.

Eleventh Preferred Embodiment

This embodiment relates to a slit for separating the product region 78 from the resin structure 70b described in the eighth embodiment.

Figure 15A:
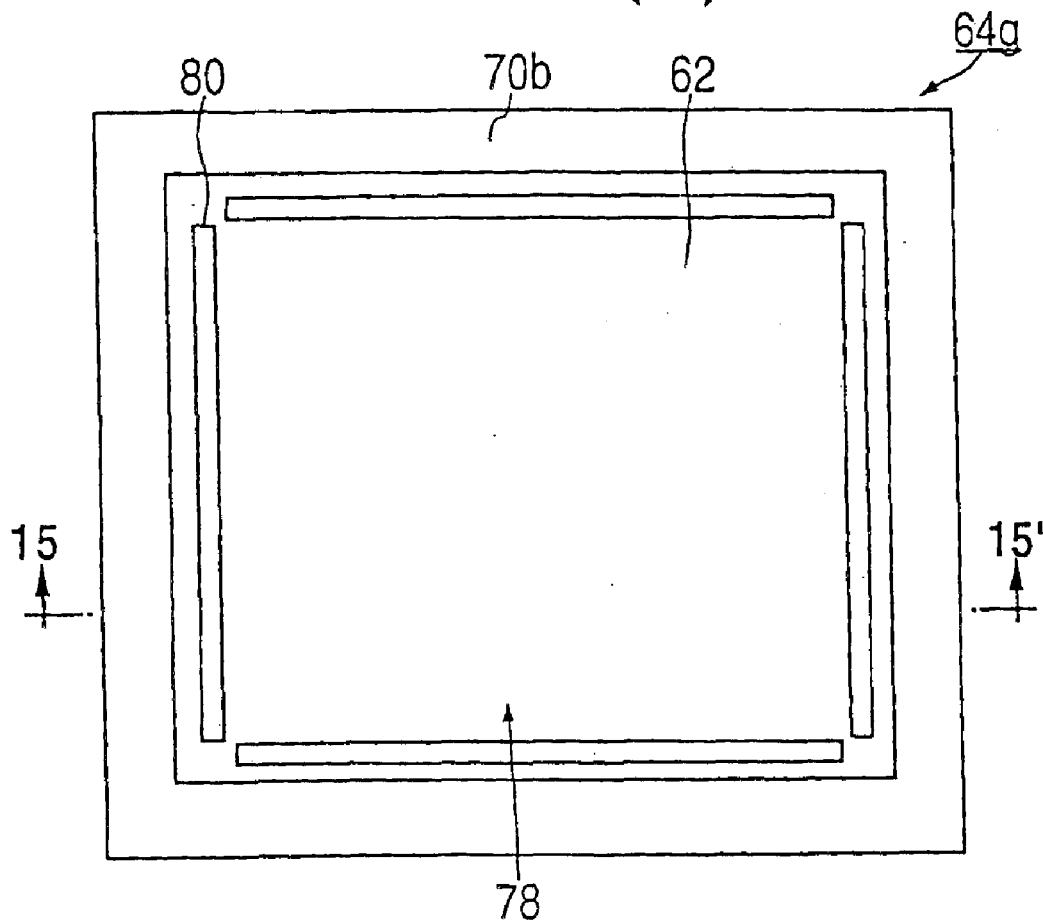
FIG. 15(A) is a plan view from an external terminal surface 62b side, which shows a resin sealed intermediate structure 64g.

FIG. 15(A) is a plan view from the external terminal surface 62b side, which shows the resin sealed intermediate structure 64g.

Figure 15B:
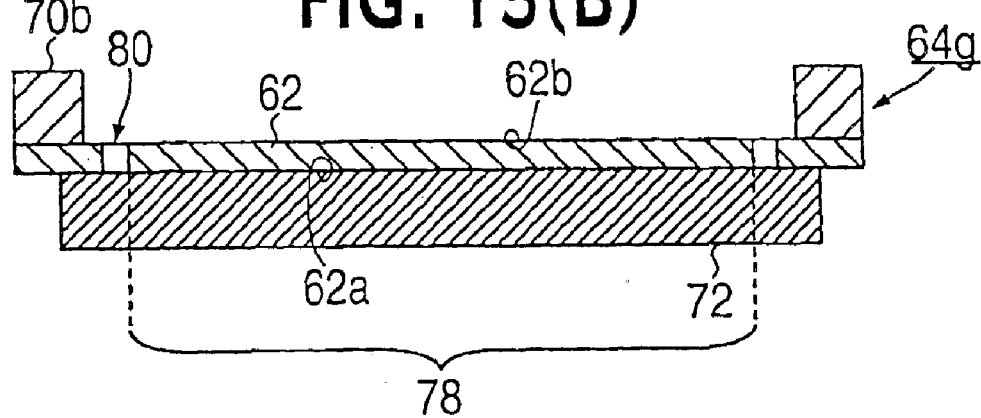
FIG. 15(B) is a cross sectional view of the semiconductor device of FIG. 15(A) taken along the line 15-15'.

FIG. 15(B) is a cross sectional view of the semiconductor device of FIG. taken along the line 15-15'.

As illustrated in FIGS. 15(A) and (B), slits 80 passing through the wiring substrate 62 are formed inside the resin structure 70b. Each of the slits 80 is formed along a corresponding one of inner sides of the resin structure 70b.

Since the slits 80 are provided in the wiring substrate 62b, the product region 78 may be easily and accurately separated from the resin structure 70b.

The slits 80 are not limited to such these particular patterns. A plurality of slits which are formed along corresponding ones of inner sides of the resin structure 70b may be applicable to this embodiment.

As described above, since the adhesive tape is adhered to the wiring substrates of the preliminary structures, the preliminary structures may be processed and transferred all at once.

In one of conventional process steps, silicon chips are transferred to a bonding stage one by one and then a wiring substrate is connected to the silicon chip to obtain a preliminary structure. The present invention may avoid such individual transferring of the silicon chips. Therefore, a manufacturing time period and a manufacturing cost may be reduced.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A method of making a plurality of semiconductor devices, comprising:

preparing a semiconductor wafer having a first surface and a second surface opposite to the first surface, wherein a plurality of semiconductor chip regions are formed on the first surface of the semiconductor wafer and wherein an interval between the semiconductor chip regions neighboring each other is approximately equal to a cutting line having a dicing width;

forming a plurality of electrodes on each of the semiconductor chip regions;

preparing a wiring substrate having a first surface and a second surface opposite to the first surface of the wiring substrate, wherein a plurality of device mounting areas are defined on the first surface of the wiring substrate;

mounting the semiconductor wafer on the wiring substrate so that the semiconductor chip regions and the device mounting areas face each other;

filling a sealing resin between the semiconductor wafer and the wiring substrate, wherein the second surface of the semiconductor wafer and the second surface of the wiring substrate are exposed from the sealing resin; and dividing the semiconductor wafer and the wiring substrate at the cutting line into a plurality of the semiconductor devices, wherein the semiconductor devices each have a semiconductor chip and a divided wiring substrate, and wherein a peripheral edge of the semiconductor chip is aligned with a peripheral edge of the divided wiring substrate.

2. The method according to claim 1, wherein the plurality of the semiconductor chip regions are arranged in a matrix form so that the semiconductor chip regions are separated by the cutting lines.

3. The method according to claim 1, wherein the wiring substrate includes glass epoxy, ceramic or polyimide.

4. The method according to claim 1, wherein side edges of the divided wiring substrates and the semiconductor chips are exposed from the sealing resin.

5. The method according to claim 1, wherein a size of the divided wiring substrates and a size of the semiconductor chips are substantially the same.

6. A method of making a plurality of semiconductor devices, comprising:

preparing a semiconductor wafer having a first surface and a second surface opposite to the first surface, wherein a plurality of semiconductor chip regions are formed on the first surface of the semiconductor wafer and wherein an interval between the semiconductor chip regions neighboring each other is approximately equal to a cutting line having a dicing width;

forming a plurality of electrodes on each of the semiconductor chip regions;

preparing a wiring substrate having a first surface and a second surface opposite to the first surface of the wiring substrate, wherein a plurality of device mounting areas are defined on the first surface of the wiring substrate;

mounting the semiconductor wafer on the wiring substrate so that the semiconductor chip regions and the device mounting areas face each other;

filling a sealing resin between the semiconductor wafer and the wiring substrate, wherein the second surface of the semiconductor wafer and the second surface of the wiring substrate are exposed from the sealing resin; and dividing the semiconductor wafer and the wiring substrate at the cutting line into a plurality of the semiconductor devices, wherein a cross section of a divided semiconductor wafer and a cross section of a divided wiring substrate are approximately perpendicular to the second surface of the wiring substrate, and both of the cross sections are included in a same plane.

7. The method according to claim 6, wherein the plurality of the semiconductor chip regions are arranged in a matrix form so that the semiconductor chip regions are separated by the cutting lines.

8. The method according to claim 6, wherein the wiring substrate includes glass epoxy, ceramic or polyimide.

9. The method according to claim 6, wherein side edges of the divided wiring substrates and the divided semiconductor wafers are exposed from the sealing resin.

10. The method according to claim 6, wherein a size of the divided wiring substrates and a size of the divided semiconductor wafers are substantially the same.

* * * * *